United States Patent
Wang

(10) Patent No.: US 10,536,129 B2
(45) Date of Patent: Jan. 14, 2020

(54) IMPEDANCE MATCHING CIRCUIT AND INTEGRATED CIRCUIT APPLYING THE IMPEDANCE MATCHING CIRCUIT

(71) Applicant: Realtek Semiconductor Corp., HsinChu (TW)

(72) Inventor: Shih-Wei Wang, Hualien (TW)

(73) Assignee: Realtek Semiconductor Corp., HsinChu (TW)

( * ) Notice: Subject to any disclaimer, the term of this patent is extended or adjusted under 35 U.S.C. 154(b) by 31 days.

(21) Appl. No.: 15/869,105

(22) Filed: Jan. 12, 2018

(65) Prior Publication Data
US 2018/0205359 A1    Jul. 19, 2018

(30) Foreign Application Priority Data
Jan. 18, 2017    (TW) .............................. 106101623 A

(51) Int. Cl.
*H03H 7/40*   (2006.01)
*H03H 7/06*   (2006.01)

(52) U.S. Cl.
CPC ................ *H03H 7/40* (2013.01); *H03H 7/06* (2013.01)

(58) Field of Classification Search
CPC .................................. H03H 7/40; H03H 7/06
See application file for complete search history.

(56) References Cited

U.S. PATENT DOCUMENTS

| | | | |
|---|---|---|---|
| 5,459,440 A * | 10/1995 | Claridge | H03H 11/30 333/17.3 |
| 7,221,193 B1 | 5/2007 | Wang | |
| 2007/0188187 A1 * | 8/2007 | Oliva | H04L 25/0278 326/30 |

* cited by examiner

*Primary Examiner* — Stephen E. Jones
*Assistant Examiner* — Samuel S Outten
(74) *Attorney, Agent, or Firm* — Winston Hsu

(57) ABSTRACT

An impedance matching circuit includes a variable impedance circuit, a reference voltage generating circuit and a control circuit. The variable impedance circuit is configured for coupling to a load having an impedance and has a variable impedance; the reference voltage generating circuit coupled to the variable impedance circuit is configured to receive an input voltage of the variable impedance circuit to generate a reference voltage; and the control circuit coupled to the variable impedance circuit and configured to generate a control signal according to the reference voltage and an output voltage of the variable impedance circuit to control the variable impedance to make the variable impedance match the impedance of the load.

11 Claims, 4 Drawing Sheets

IMPEDANCE MATCHING CIRCUIT AND INTEGRATED CIRCUIT APPLYING THE IMPEDANCE MATCHING CIRCUIT

BACKGROUND OF THE INVENTION

1. Field of the Invention

The present invention relates to an impedance matching circuit and an integrated circuit applying the impedance matching circuit.

2. Description of the Prior Art

In recent years, the rapid developments within the computer and communication industry have resulted in integrated circuits (ICs) installed within electronic devices being adapted for high frequency band and high speed. The operating frequency level for those ICs is up to GHz. Therefore, when the ICs and connected external circuits (e.g. a transmission line) are not impedance matched, additional power will be severely consumed. On a transmission channel, an appropriate impedance matching is required when data is transmitted at high speed in order to achieve a low error rate for transmission and reception. Inappropriate terminal resistance which prevents the impedance from matching causes reflection or echo on the transmission line. The reflection can also result in data distortion and a low bit rate of the system. Conventionally, the transmission line driver in an IC is a voltage driver which provides an output current to drive the loading (i.e. the transmission line). For matching the impedance of the transmission line, the impedance of the driver is about 50 ohms to 150 ohms (this will vary with the length of the transmission line, the temperature, and other factors). Therefore, impedance matching is difficult to achieve.

SUMMARY OF THE INVENTION

One of the objectives of the present invention is to provide an impedance matching circuit and an IC applying the impedance matching circuit to solve the aforementioned problem.

According to an embodiment of the present invention, an impedance matching circuit is disclosed, comprising: a variable impedance circuit, a reference voltage generating circuit and a control circuit, wherein the variable impedance circuit is configured for coupling to a load having an impedance and has a variable impedance; the reference voltage generating circuit coupled to the variable impedance circuit is being configured to receive an input voltage from the variable impedance circuit to generate a reference voltage; and the control circuit coupled to the variable impedance circuit is being configured to generate a control signal to control the variable impedance according to the reference voltage and an output voltage of the variable impedance circuit to make the variable impedance match the impedance of the load.

According to an embodiment of the present invention, an integrated circuit is disclosed, comprising: an impedance matching circuit. The impedance matching circuit comprises a variable impedance circuit, a reference voltage generating circuit and a control circuit, wherein the variable impedance circuit is configured for coupling to a load having an impedance and has a variable impedance; the reference voltage generating circuit coupled to the variable impedance circuit is being configured to receive an input voltage from the variable impedance circuit to generate a reference voltage; and the control circuit coupled to the variable impedance circuit is being configured to generate a control signal to control the variable impedance according to the reference voltage and an output voltage of the variable impedance circuit in order to make the variable impedance match the impedance of the load. The load is installed outside the integrated circuit and has a transmission line impedance.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should not be interpreted as a close-ended term such as "consist of". Also, the term "couple" is intended to mean either an indirect or direct electrical connection. Accordingly, if one device is coupled to another device, that connection may be through a direct electrical connection, or through an indirect electrical connection via other devices and connections.

Figure 1:
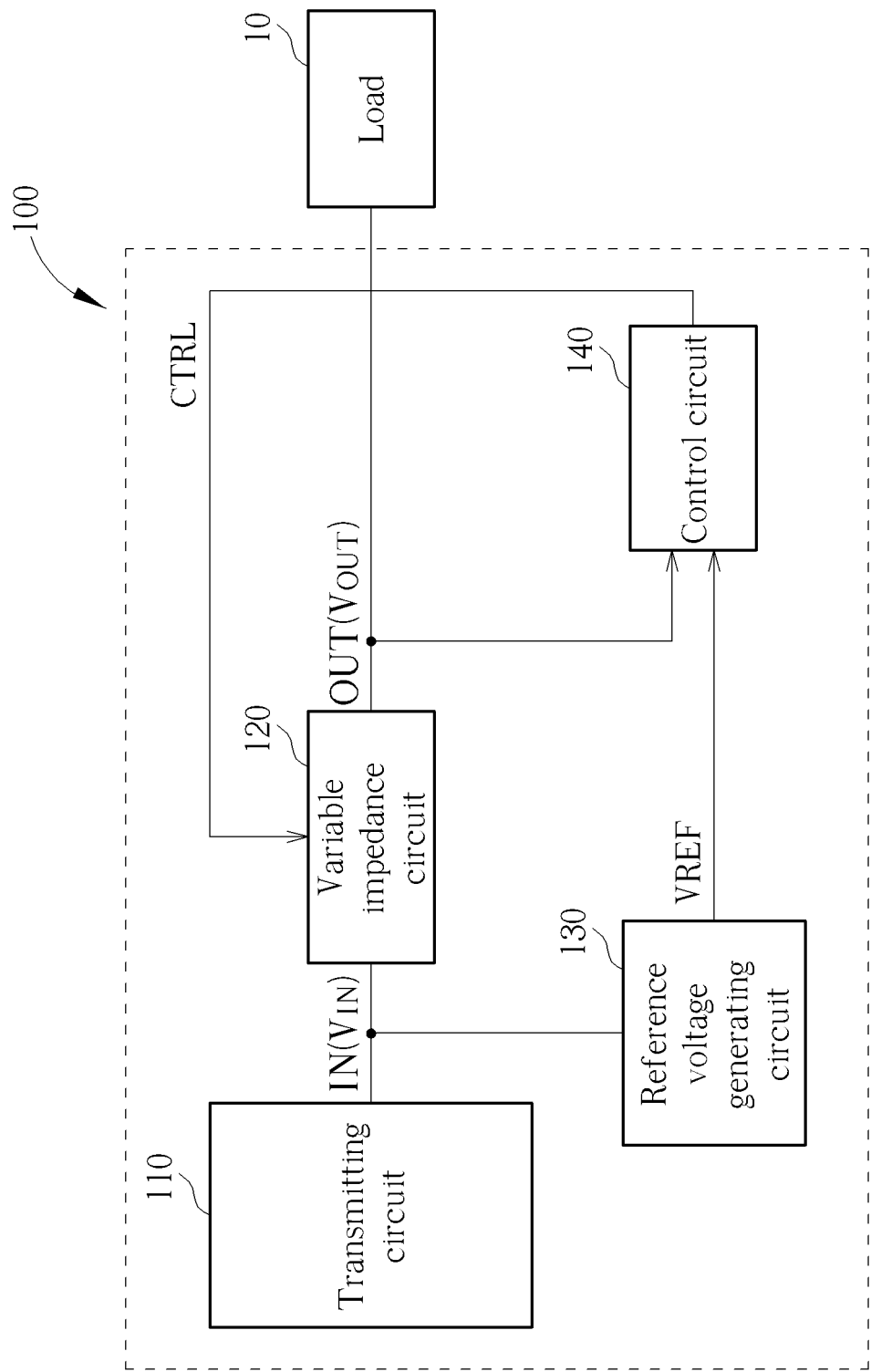
FIG. 1 is a diagram illustrating an impedance matching circuit according to an embodiment of the present invention.

FIG. 1 is a diagram illustrating an impedance matching circuit 100 according to an embodiment of the present invention. As shown in FIG. 1, the impedance matching circuit 100 comprises a transmitting circuit 110, a variable impedance circuit 120, a reference voltage generating circuit 130, and a control circuit 140. The impedance matching circuit 100 is coupled to a load 10 having an impedance via an output terminal OUT. In one embodiment, the impedance matching circuit 100 is installed within an integrated circuit (IC), wherein the output terminal OUT can be coupled to an output pad. In addition, the load 10 is installed outside the IC and has an equivalent impedance as seen from the output terminal OUT. The load 10 may include a transformer, a transmission line and another IC having an impedance. This, however, is only for illustrative purposes, and not a limitation of the present invention. In other embodiments, the impedance matching circuit 100 and the load 10 can be installed in the same IC. In one embodiment, the transmitting circuit 110 can be a transmission line driving circuit (mentioned in the prior art) including at least an amplifier providing a current to drive the load 10. In other embodiments, the transmitting circuit 110 can be a different kind of circuitry providing a voltage or a current. The type of transmitting circuit 110 is not a limitation of the present invention. It should be noted that there is only one variable impedance circuit, one reference voltage generating circuit and one control circuit depicted in FIG. 1; however, those skilled in the art should understand that it is possible to have another set of impedance circuit, reference voltage generating circuit and control circuit installed on another output terminal of the transmitting circuit 110. In this embodiment, the transmitting circuit 110 provides an input voltage VIN via an input terminal IN to the variable impedance circuit 120 and the reference voltage generating circuit 130. The reference voltage generating circuit 130 generates a reference voltage VREF according to the input voltage VIN. The control circuit 140 receives an output voltage VOUT from the output terminal OUT of the variable impedance circuit 120 and the reference voltage VREF from the reference voltage generating circuit 130 to generate a control signal CTRL to the variable impedance circuit 120. An impedance value of the variable impedance circuit 120 is adjusted to match the impedance of the load 10 according to the control signal CTRL.

Figure 2:
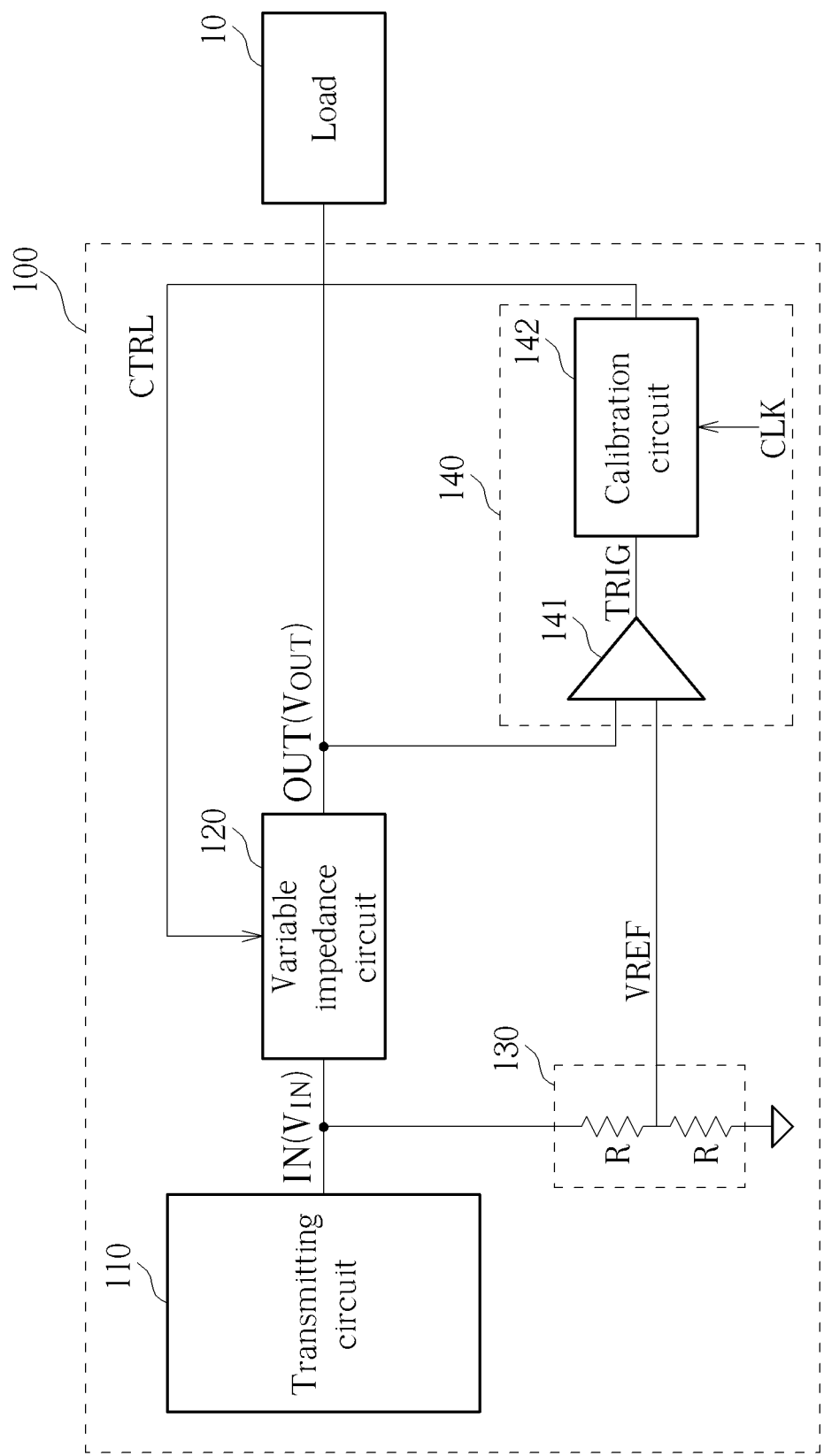
FIG. 2 is a diagram illustrating a reference voltage generating circuit and a control circuit of the impedance matching circuit shown in FIG. 1.

FIG. 2 is a diagram illustrating the reference voltage generating circuit 130 and the control circuit 140 of the impedance matching circuit 100 shown in FIG. 1. As shown in FIG. 2, the reference voltage generating circuit 130 includes a voltage dividing circuit that includes two resistors connected in series for performing a voltage dividing operation of the input voltage VIN to generate the reference voltage VREF. The control circuit 140 includes a comparator 141 and a calibration circuit 142. The calibration circuit 142 may be a digital circuit for receiving a clock signal CLK to constantly generate the control signal CTRL to the variable impedance circuit 120. The impedance value of the variable impedance circuit 120 can vary (increase or decrease) according to the control signal CTRL. The control signal CTRL can be a digital signal, wherein the value of the digital signal sequentially increases or decreases with every pulse of the clock signal CLK, and the impedance value of the variable impedance circuit 120 can increase or decrease accordingly. This is only for illustrative purposes, however. The implementation of the calibration circuit 142 and the generation of the control signal CTRL are not limited thereof. Alternative designs also fall within the scope of the present invention as long as they include a variable impedance circuit 120 whose impedance value can be adjusted according to the control signal CTRL. The comparator 141 is arranged to compare the output voltage VOUT and the reference voltage VREF to generate a trigger signal TRIG to the calibration circuit 142. More specifically, the reference voltage VREF is generated by a voltage division which is half of the input voltage VIN (i.e. VREF=VIN/2). When the impedance value of the variable impedance circuit 120 increases or decrease according to the control signal CTRL, the output voltage VOUT changes accordingly. When the output voltage VOUT is substantially equal to the reference voltage VREF, it means that the impedance value of the variable impedance circuit 120 and the impedance of the load 10 match, and the trigger signal TRIG inverts (i.e. changes from logic value '0' to logic value '1' or from logic value '1' to logic value '0'). Finally, the calibration circuit 142 may record the impedance value when the inversion of the trigger signal TRIG occurs, and thus control to enable the impedance value of the variable impedance circuit 120 to be substantially equal to the impedance value of the load 10 for impedance matching.

Figure 3:
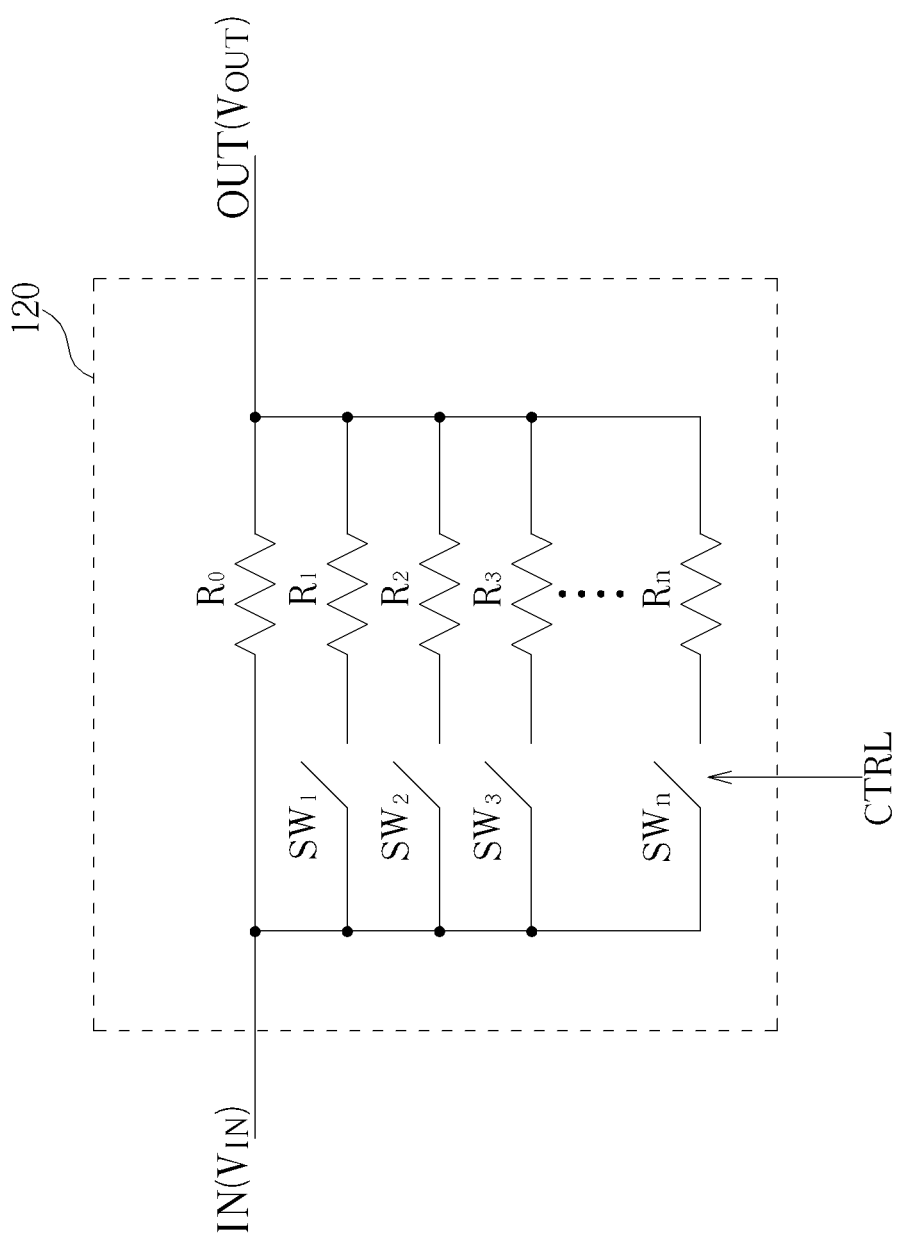
FIG. 3 is a diagram illustrating a variable impedance circuit of the impedance matching circuit shown in FIG. 1.

FIG. 3 is a diagram illustrating the variable impedance circuit 120 of the impedance matching circuit 100 shown in FIG. 1. As shown in FIG. 3, the variable impedance circuit 120 comprises a resistor array, wherein the resistor array comprises a plurality of resistors $R_0$-$R_n$, and a plurality of corresponding switches $SW_1$-$SW_n$. When the control signal CTRL sequentially increases according to the clock signal CLK, the switches $SW_1$-$SW_n$ are sequentially closed, and the resistor $R_0$ connects with more resistors in parallel. In other words, when the control signal sequentially increases, the impedance value of the variable impedance circuit 120 sequentially decreases. It should be noted that this is only for illustrative purposes, and not a limitation of the present invention. In other embodiments, when the control signal sequentially increases, the impedance value of the variable impedance circuit 120 sequentially increases as well. In addition, the implementation of the resistor array is not a limitation of the present invention. Alternative designs should also fall within the scope of the present invention as long as they comprise a variable impedance circuit whose impedance value varies with the control signal CTRL.

Figure 4:
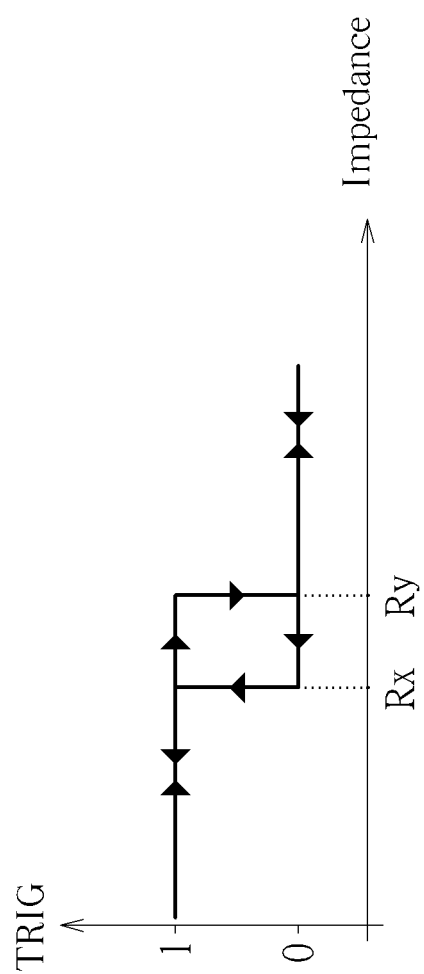
FIG. 4 is a diagram illustrating a trigger signal and an impedance of the variable impedance circuit varying with the trigger signal according to an embodiment of the present invention.

FIG. 4 is a diagram illustrating the trigger signal TRIG and the impedance value of the variable impedance circuit 120 varying with the trigger signal TRIG according to an embodiment of the present invention. Referring to FIG. 4, when the control signal is increased with the pulse of the clock signal CLK, the impedance value of the variable impedance circuit 120 decreases sequentially due to the resistor $R_0$ connecting with more resistors in parallel, which makes the output voltage VOUT sequentially increase. When the impedance value of the variable impedance circuit 120 is $R_x$ and matches the load 10, the trigger signal TRIG changes to logic value '1' from logic value '0'. The control circuit 140 records the impedance value $R_x$. Likewise, when the control signal is decreased with the pulse of the clock signal CLK, the impedance value of the variable impedance circuit 120 sequentially increases because the switches are sequentially opened which makes the output voltage OUT decrease sequentially. When the impedance value of the variable impedance circuit 120 is $R_y$ and matches the load 10, the trigger signal TRIG changes to logic value '0' from logic value '1'. The control circuit 140 records the impedance value $R_x$. If the impedance value $R_x$ is not equal to the impedance value $R_y$, the control circuit 149 determines which impedance value is closer to the load 10 and chooses the closer one to be the impedance value of the variable impedance circuit 129. It should be noted that the control signal CTRL varies in an ascending manner rather than a descending manner in this embodiment; however, in other embodiments, the control signal can vary in an ascending manner or a descending manner, and only one impedance value is recorded.

Briefly summarized, the present invention provides an impedance matching circuit. By generating the control signal to the variable impedance circuit via a feedback path, wherein the control signal is generated related to an input voltage generated by a transmitting circuit within the impedance matching circuit, the impedance of the impedance matching circuit can match the impedance of the transmission line installed outside the IC to lower extra power consumption when the impedance does not match and improves bit rate of data.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An impedance matching circuit, comprising:
a variable impedance circuit, coupled to an impedance, wherein the variable impedance circuit comprises a variable impedance;
a reference voltage generating circuit, coupled to the variable impedance circuit, wherein the reference voltage generating circuit is arranged to receive an input voltage of the variable impedance circuit to generate a reference voltage; and
a control circuit, coupled to the variable impedance circuit, wherein the control circuit is arranged to generate a control signal according to the reference voltage and an output voltage of the variable impedance circuit for controlling the variable impedance to make the variable impedance match the impedance, the control circuit comprising:
a comparator, arranged to compare the output voltage and the reference voltage to generate a trigger signal, the trigger signal being a logic signal; and
a calibration circuit, arranged to receive the trigger signal and a pulsed clock input, wherein when the trigger signal is received, the calibration circuit generates the control signal at each pulse of the pulsed clock input, and the control signal sequentially increases or decreases with each pulse to selectively control the variable impedance by sequentially increasing or decreasing the variable impedance.

2. The impedance matching circuit of claim 1, wherein the reference voltage is half of the input voltage, and the variable impedance matches the impedance when the reference voltage is equal to the output voltage.

3. The impedance matching circuit of claim 2, wherein the reference voltage generating circuit comprises:
a voltage dividing circuit, arranged to perform a voltage division with a plurality of resistors upon the input voltage to generate the reference voltage.

4. The impedance matching circuit of claim 2, wherein the variable impedance circuit comprises a resistor array, and the resistor array comprises a plurality of resistors connecting in parallel and a plurality of corresponding switches, and the control circuit changes statuses of the plurality of corresponding switches with the control signal to change the variable impedance.

5. The impedance matching circuit of claim 1, wherein the impedance is installed outside an integrated circuit (IC) comprising the impedance matching circuit.

6. The impedance matching circuit of claim 5, wherein the input voltage of the variable impedance circuit is generated from a transmitting circuit, and the output voltage of the variable impedance circuit is transmitted to the impedance via a terminal or a pin of the IC, and the impedance comprises a transmission line impedance.

7. The impedance matching circuit of claim 1, wherein the calibration circuit controls the variable impedance with the control signal to make the variable impedance have a matching impedance value, wherein the matching impedance value is generated when the trigger signal changes to a second logic value from a first logic value.

8. The impedance matching circuit of claim 1, wherein when the output voltage matches the reference voltage, the comparator resets the trigger signal.

9. An integrated circuit (IC), comprising:
an impedance matching circuit, wherein the impedance matching circuit comprises:
a variable impedance circuit, coupled to an impedance, wherein the variable impedance circuit comprises a variable impedance;
a reference voltage generating circuit, coupled to the variable impedance circuit, wherein the reference voltage generating circuit is arranged to receive an input voltage of the variable impedance circuit to generate a reference voltage; and
a control circuit, coupled to the variable impedance circuit, wherein the control circuit is arranged to generate a control signal according to the reference voltage and an output voltage of the variable impedance circuit for controlling the variable impedance to make the variable impedance match the impedance, the control circuit comprising:
a comparator, arranged to compare the output voltage and the reference voltage to generate a trigger signal being a logic signal; and
a calibration circuit, arranged to receive the trigger signal and a pulsed clock input, wherein when the trigger signal is received, the calibration circuit generates the control signal at each pulse of the pulsed clock input, and the control signal sequentially increases or decreases with each pulse to selectively control the variable impedance by sequentially increasing or decreasing the variable impedance;
wherein the impedance is installed outside the IC and comprises a transmission line impedance.

10. The IC of claim 9, wherein the reference voltage is half of the input voltage, and the variable impedance matches the impedance when the reference voltage is equal to the output voltage.

11. The IC of claim 9, wherein when the output voltage matches the reference voltage, the comparator resets the trigger signal.

* * * * *